(12) United States Patent
Kikuchi et al.

(10) Patent No.: US 8,072,073 B2
(45) Date of Patent: Dec. 6, 2011

(54) SEMICONDUCTOR DEVICE AND METHOD OF MANUFACTURING SAME

(75) Inventors: Katsumi Kikuchi, Tokyo (JP); Shintaro Yamamichi, Tokyo (JP); Masaya Kawano, Kawasaki (JP); Kouji Soejima, Kawasaki (JP)

(73) Assignees: NEC Corporation, Tokyo (JP); Renesas Electronics Corporation, Kanagawa (JP)

( * ) Notice: Subject to any disclaimer, the term of this patent is extended or adjusted under 35 U.S.C. 154(b) by 431 days.

(21) Appl. No.: 12/210,702

(22) Filed: Sep. 15, 2008

(65) Prior Publication Data
US 2009/0072404 A1 Mar. 19, 2009

(30) Foreign Application Priority Data
Sep. 13, 2007 (JP) ................ 2007-238014

(51) Int. Cl.
*H01L 29/40* (2006.01)
*H01L 21/44* (2006.01)

(52) U.S. Cl. ......... 257/758; 257/774; 438/672; 438/675

(58) Field of Classification Search .............. 257/758, 257/774; 438/672, 675
See application file for complete search history.

(56) References Cited

U.S. PATENT DOCUMENTS

| | | | | |
|---|---|---|---|---|
| 6,313,540 B1 * | 11/2001 | Kida et al. | ..................... | 257/784 |
| 6,455,943 B1 * | 9/2002 | Sheu et al. | ..................... | 257/786 |
| 6,717,272 B2 * | 4/2004 | Lee et al. | ..................... | 257/774 |
| 6,955,981 B2 * | 10/2005 | Lee et al. | ..................... | 438/612 |
| 7,081,679 B2 * | 7/2006 | Huang et al. | ..................... | 257/779 |
| 7,301,231 B2 * | 11/2007 | Antol et al. | ..................... | 257/700 |
| 7,304,385 B2 * | 12/2007 | Wang et al. | ..................... | 257/758 |
| 7,629,689 B2 * | 12/2009 | Maeda | ..................... | 257/758 |
| 2006/0226547 A1 | 10/2006 | Wang et al. | | |
| 2008/0272493 A1 * | 11/2008 | Ko et al. | ..................... | 257/760 |

FOREIGN PATENT DOCUMENTS

| | | |
|---|---|---|
| CN | 1722429 | 1/2006 |
| JP | 6334334 | 12/1994 |
| JP | 964493 | 3/1997 |
| JP | 1051105 | 2/1998 |
| JP | 1174417 | 3/1999 |
| JP | 11204560 | 7/1999 |
| JP | 2002246500 | 8/2002 |

OTHER PUBLICATIONS

Chinese Official Action—200810160807.6—Feb. 23, 2011.

* cited by examiner

*Primary Examiner* — James Mitchell
(74) *Attorney, Agent, or Firm* — Young & Thompson

(57) ABSTRACT

A highly reliable semiconductor device in which connection reliability is assured at very small vias comprises: a semiconductor substrate; a first wiring structure placed on the semiconductor substrate and having one or more first wiring layers, one or more insulating layers and a first via; a second wiring structure placed on the first wiring structure and having one or more second wiring layers, one or more second insulating layers, a second via and a third via; and an external terminal provided on the second wiring structure. The second via, which is connected to the second wiring layer of the second wiring structure and to the external terminal, has a connection interface disposed at an end of the via that is on the side of the external terminal.

19 Claims, 12 Drawing Sheets

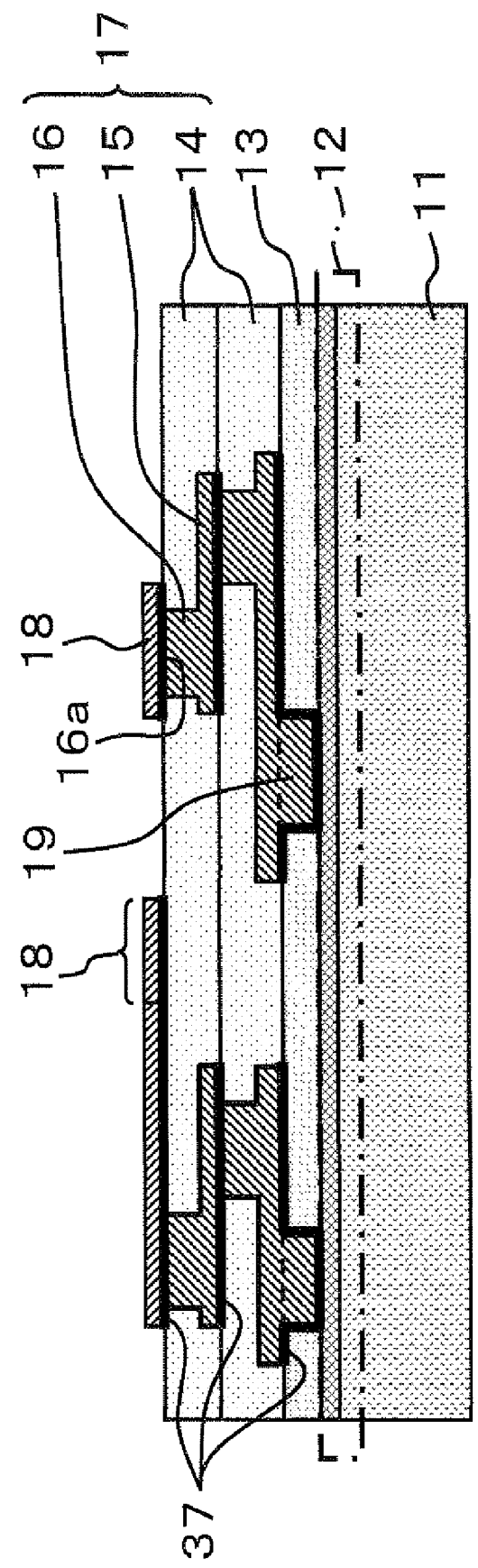
FIG. 1 (FIRST EXEMPLARY EMBODIMENT)

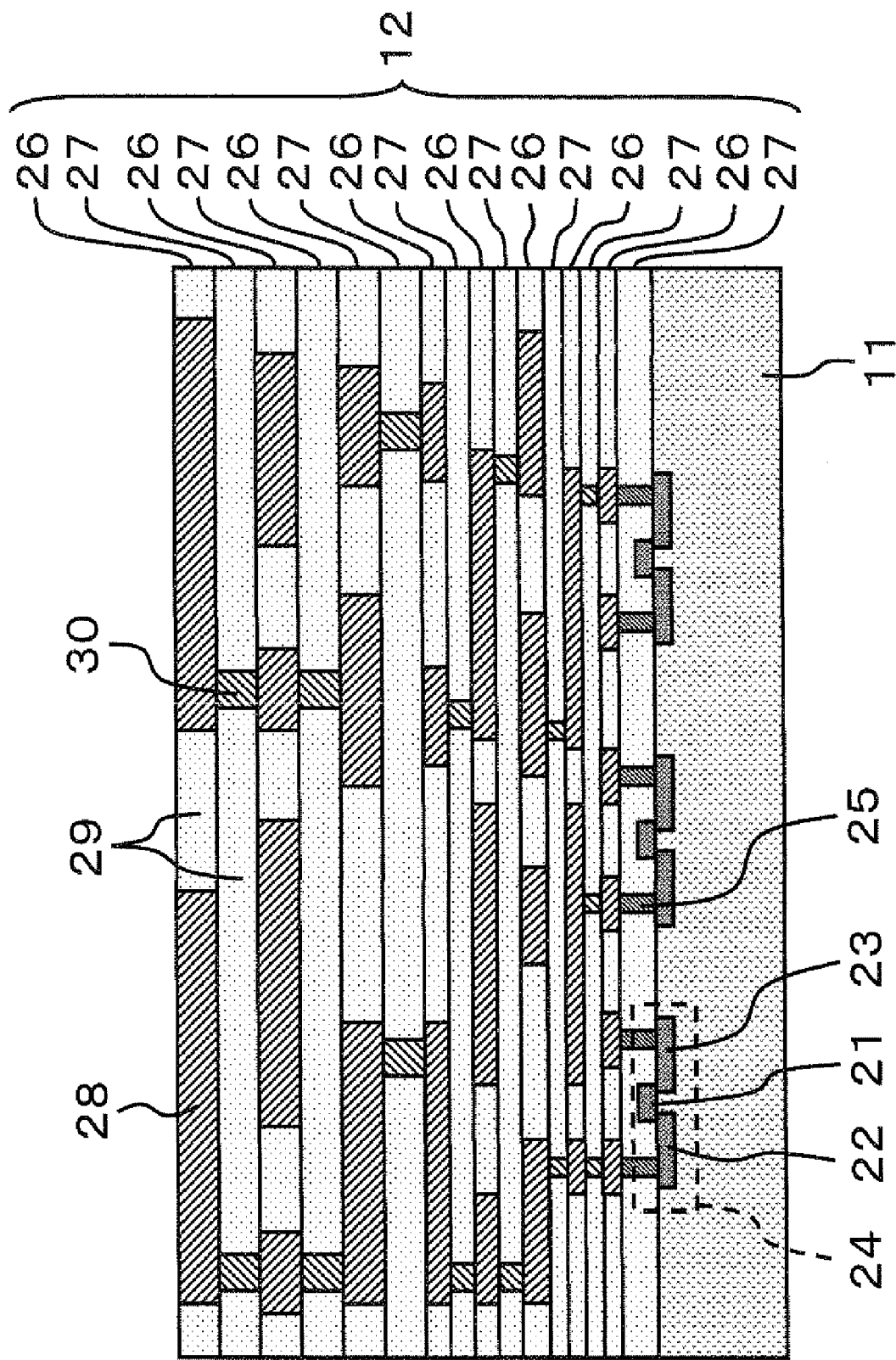

FIG. 3A (FIRST EXEMPLARY EMBODIMENT)
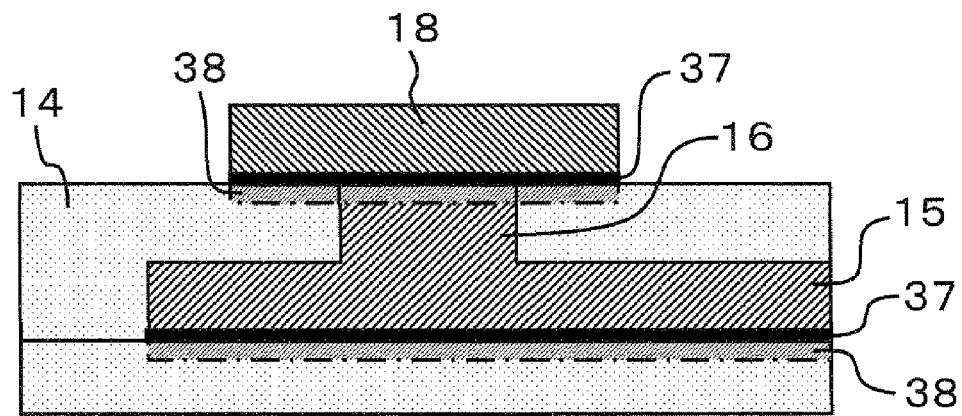
FIG. 3B (FIRST EXEMPLARY EMBODIMENT)
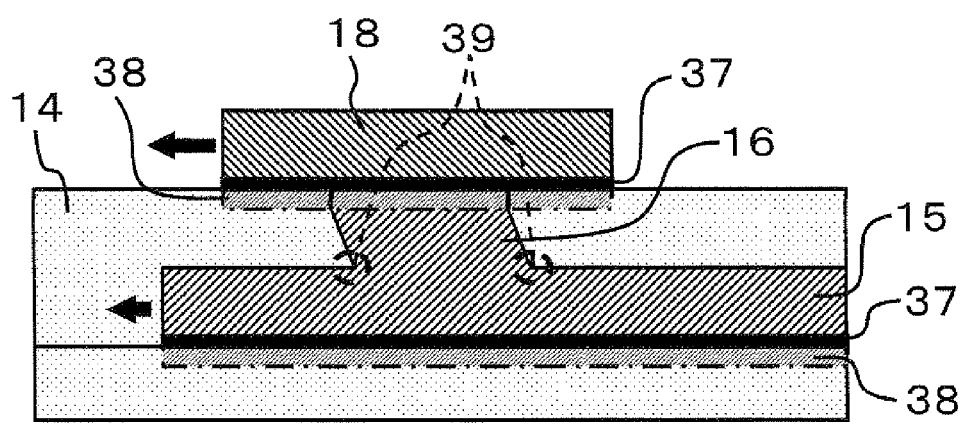

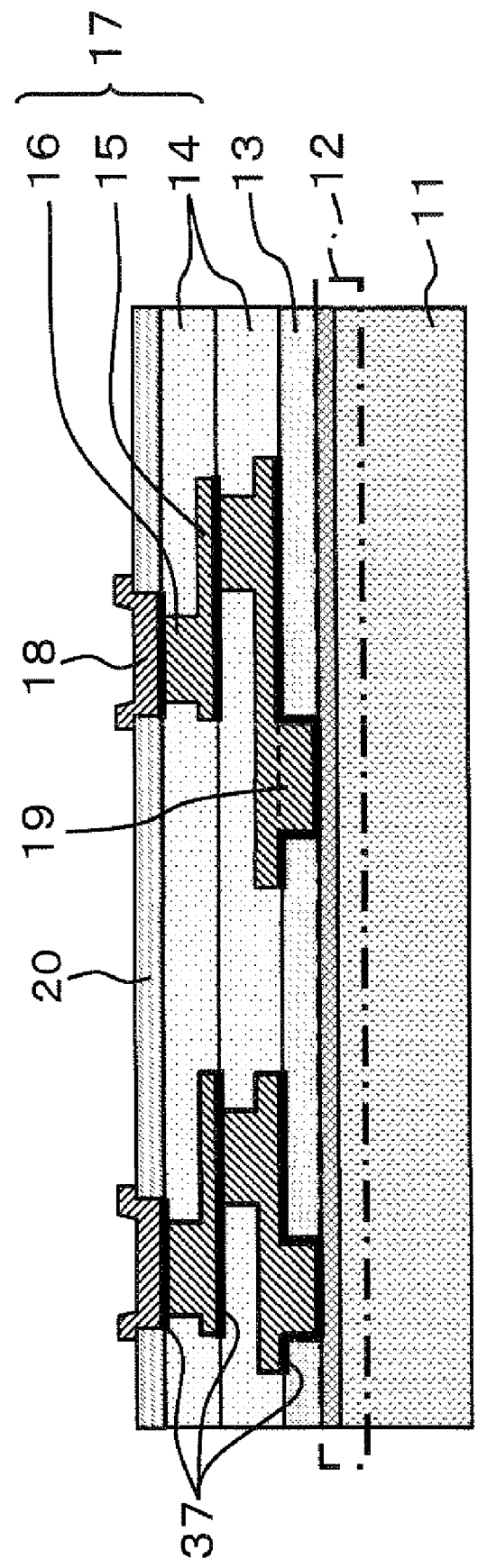
FIG. 5 (FIRST EXEMPLARY EMBODIMENT) MODIFICATION

FIG. 7A (FIRST EXEMPLARY EMBODIMENT)
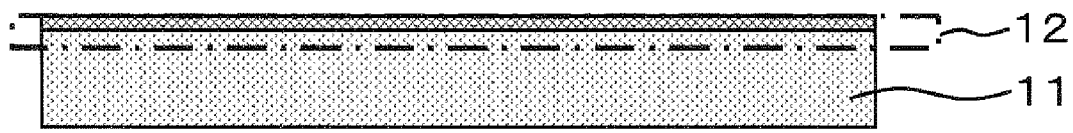
FIG. 7B (FIRST EXEMPLARY EMBODIMENT)
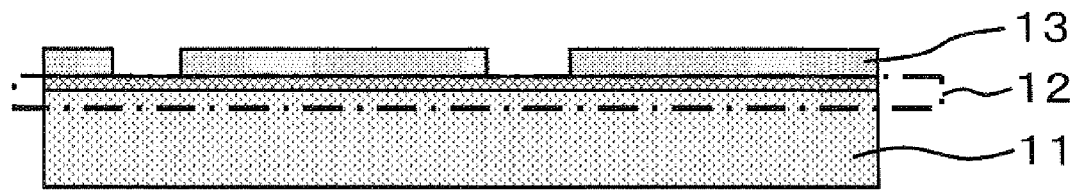
FIG. 7C (FIRST EXEMPLARY EMBODIMENT)
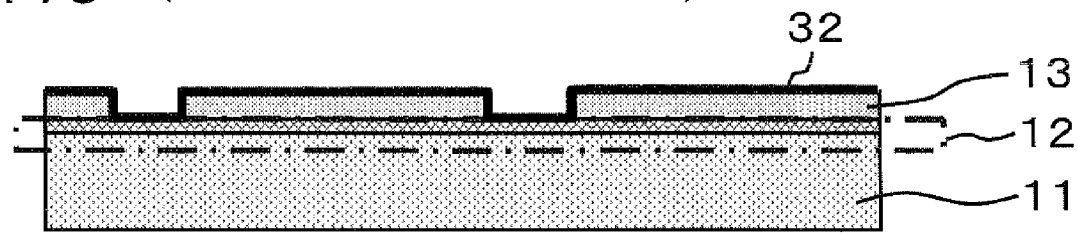
FIG. 7D (FIRST EXEMPLARY EMBODIMENT)
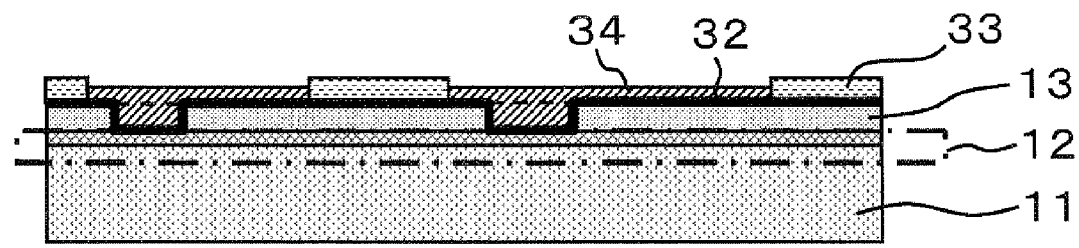
FIG. 7E (FIRST EXEMPLARY EMBODIMENT)
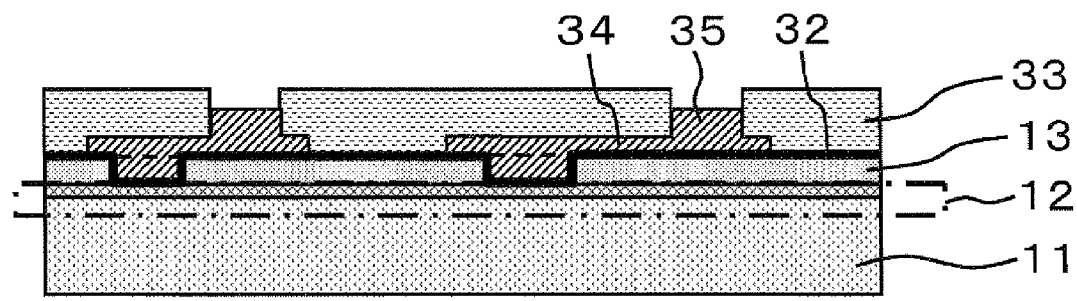

FIG. 8A (FIRST EXEMPLARY EMBODIMENT)
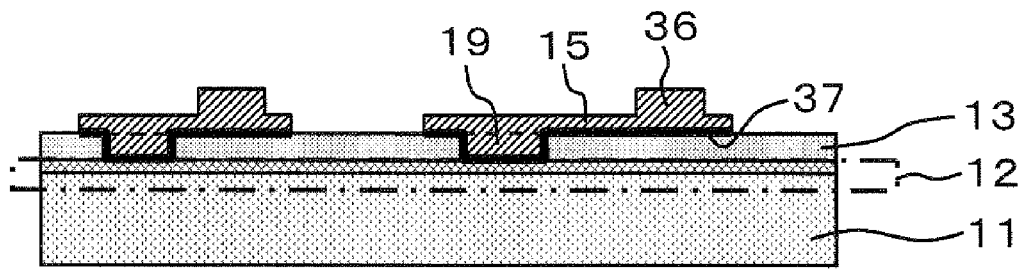
FIG. 8B (FIRST EXEMPLARY EMBODIMENT)
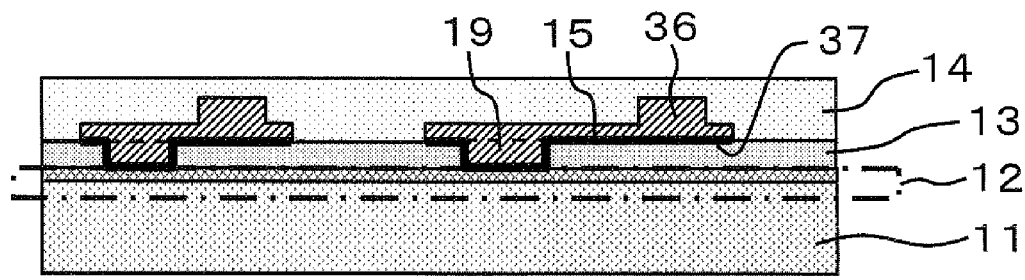
FIG. 8C (FIRST EXEMPLARY EMBODIMENT)
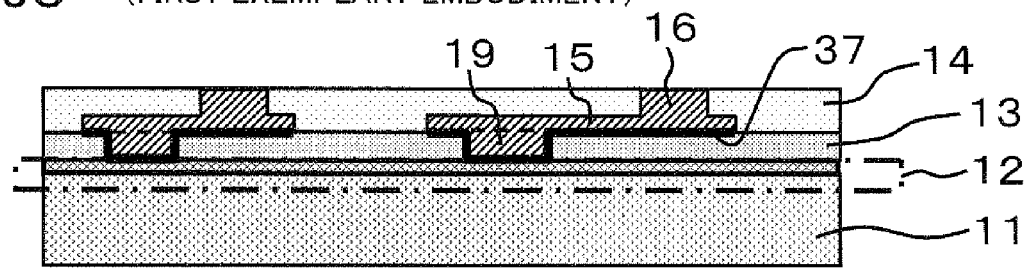
FIG. 8D (FIRST EXEMPLARY EMBODIMENT)
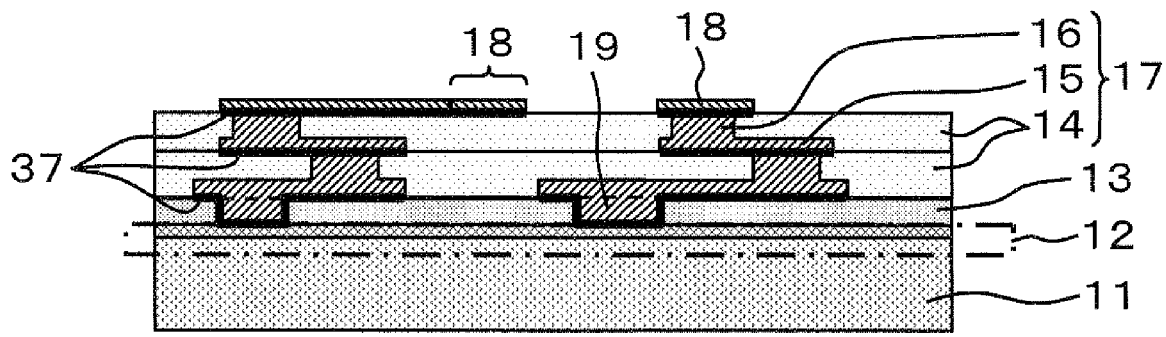

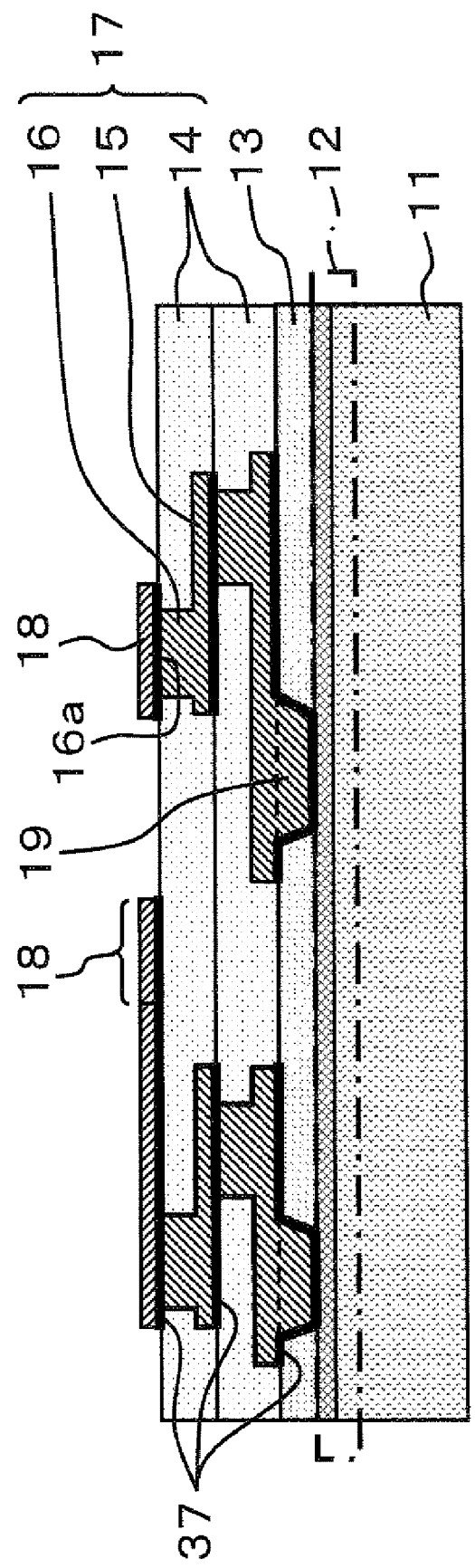
FIG. 9 (SECOND EXEMPLARY EMBODIMENT)

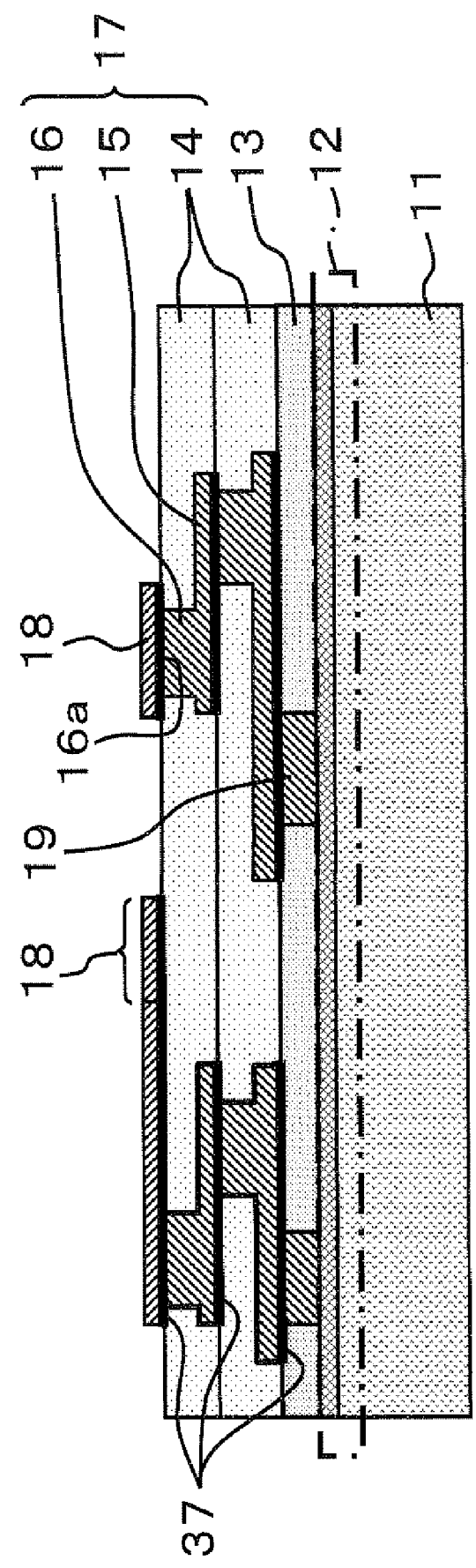
FIG. 10 (THIRD EXEMPLARY EMBODIMENT)

FIG. 11A (THIRD EXEMPLARY EMBODIMENT)
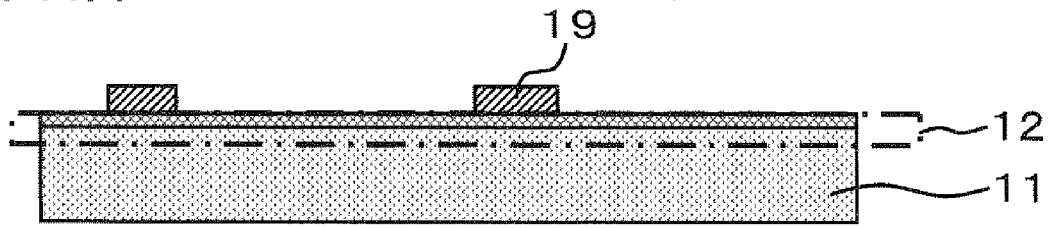
FIG. 11B (THIRD EXEMPLARY EMBODIMENT)
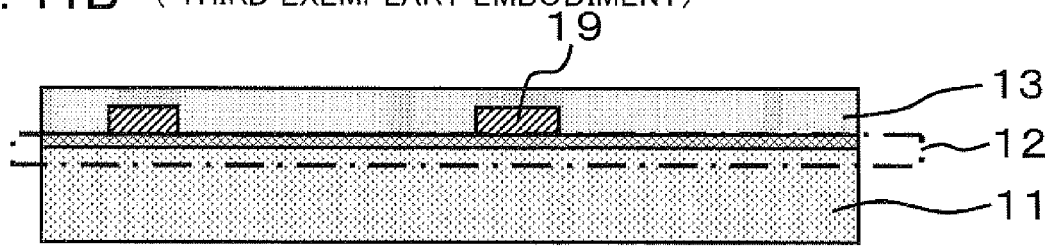
FIG. 11C (THIRD EXEMPLARY EMBODIMENT)
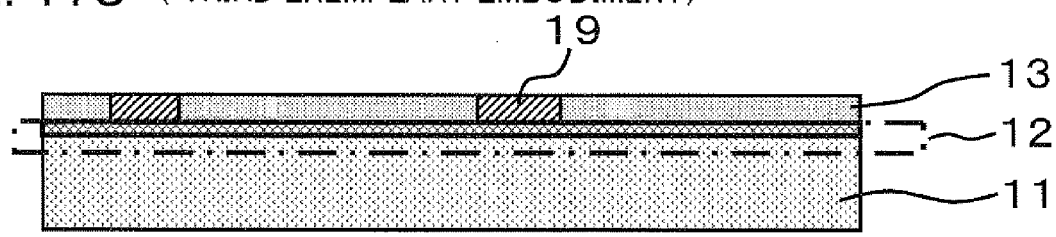
FIG. 11D (THIRD EXEMPLARY EMBODIMENT)
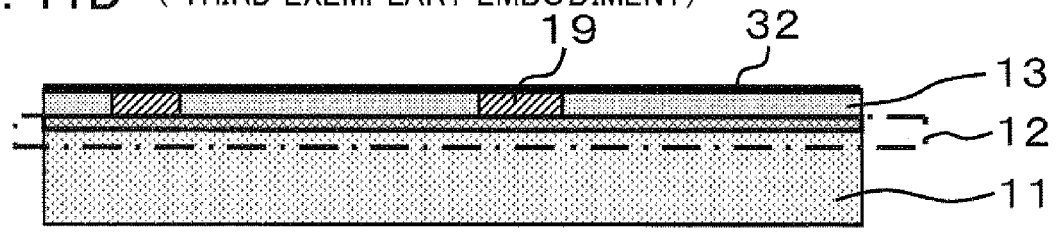
FIG. 11E (THIRD EXEMPLARY EMBODIMENT)
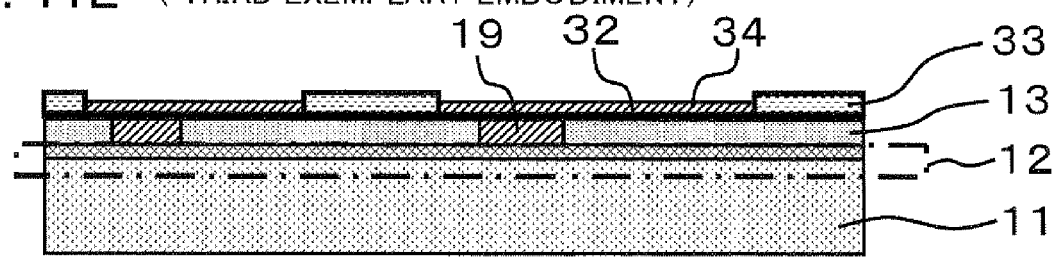

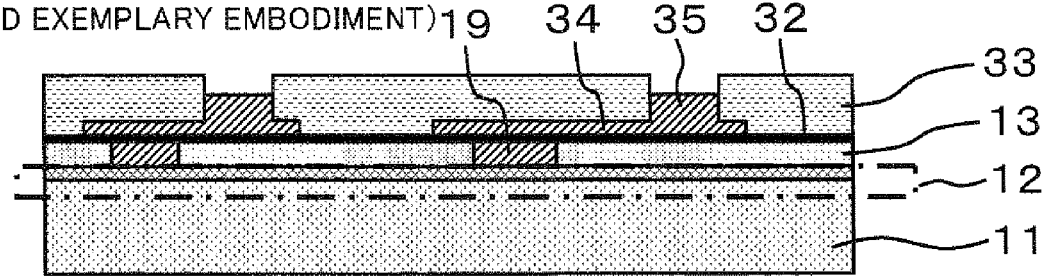
FIG. 12A (THIRD EXEMPLARY EMBODIMENT)
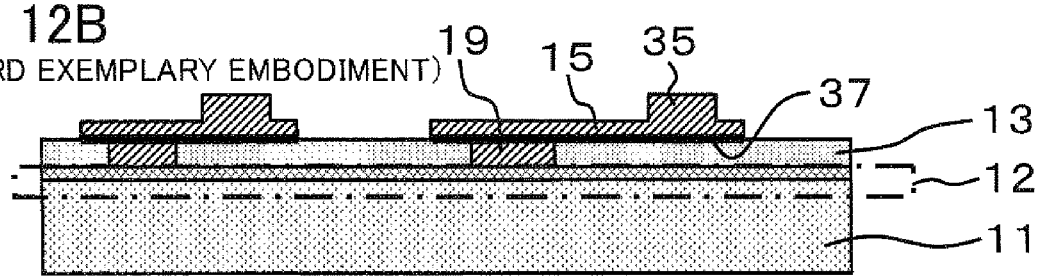
FIG. 12B (THIRD EXEMPLARY EMBODIMENT)
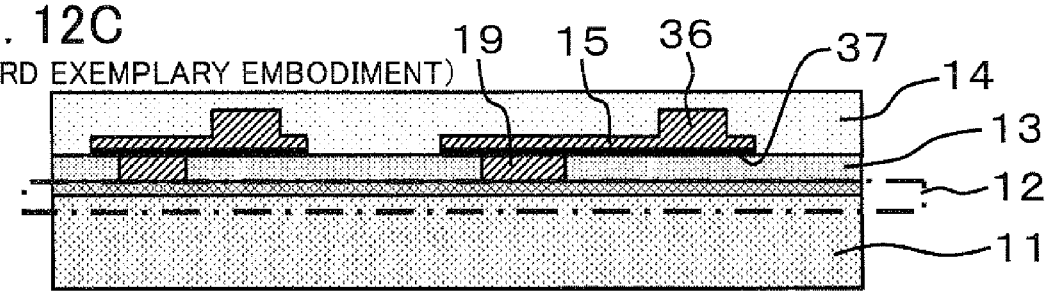
FIG. 12C (THIRD EXEMPLARY EMBODIMENT)
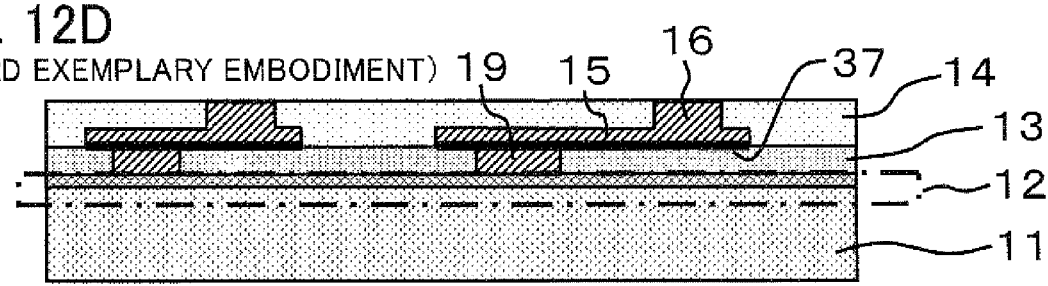
FIG. 12D (THIRD EXEMPLARY EMBODIMENT)
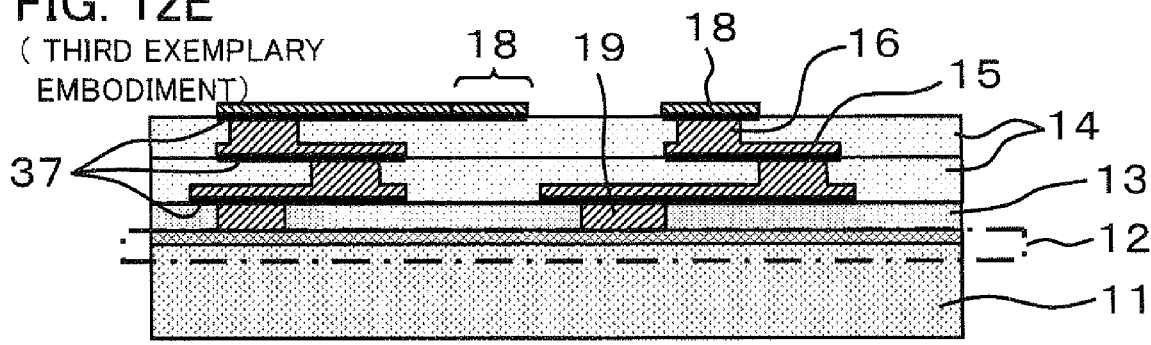
FIG. 12E (THIRD EXEMPLARY EMBODIMENT)

SEMICONDUCTOR DEVICE AND METHOD OF MANUFACTURING SAME

REFERENCE TO RELATED APPLICATION

This application is based upon and claims the benefit of the priority of Japanese patent application No. 2007-238014, filed on Sep. 13, 2007, the disclosure of which is incorporated herein in its entirety by reference thereto.

FIELD OF THE INVENTION

This invention relates to a semiconductor device and to a method of manufacturing the device. More particularly, the invention relates to a semiconductor device having a high reliability in the form of a package in which the semiconductor device has been connected to a mounting substrate, and to a method of manufacturing this device.

BACKGROUND

Electronic devices have been reduced in size and improved in functionality in recent years, and this has been accompanied by demand for size reduction and higher wiring density with regard to semiconductor chips as well. For example, with regard to a microprocessor designed according to the 90-nm rule, a clock frequency of several gigahertz and a driving current of 100 A have been attained, and further improvements in capability using conventional wiring techniques are approaching their limit. In order to realize a microprocessor in which the clock frequency exceeds 10 GHz and the driving current reaches several hundred amperes, a wiring technique of an entirely new structure is required. In particular, in the case of a semiconductor chip capable of high-speed operation, an increase in power distribution capability (wiring capacity) is sought as means for strengthening the power supply circuit serving as the source of power. On the other hand, in the case of high-speed signals, reducing parasitic capacitance produced between a signal pad and power supply circuit is important in terms of preventing a deterioration in signal characteristics. In order to improve supply of power and signal characteristics, there is need for a wafer-level re-wiring technique for fabrication on a semiconductor chip by a wiring technique different from that of the semiconductor chip.

An insulating material referred to as a "low-k material", in which the specific inductivity is 2.5 or below, is now being employed in semiconductor devices. Further, lead-free solder materials are now being employed as the material of solder balls in view of effects upon the environment. However, a low-k material has a mechanical strength, such as hardness and elastic modulus, lower than that of silicon oxide, silicon nitride and silicon oxonitride, etc., which have been used heretofore as silicon-based elements. Further, in comparison with the conventional Pb—Sn eutectic solder material, a lead-free solder material has a poor creep characteristic. The creep characteristic indicates the ease of deformation of a material. Consequently, the amount of deformation of solder balls per se following the hardening thereof is small and residual stress within the solder balls is large.

Thus, in a semiconductor device using a low-k material and lead-free solder balls, residual stress within the solder balls produced at the time of packaging and thermal stress produced at the time of use can cause breakage at connections that include solder balls, or brittle fracture, exfoliation and cracking of the low-k material, which has a low mechanical strength, and it may be difficult to assure reliability when the package is assembled or put to practice use.

Conventionally, a semiconductor chip is mounted on a mounting substrate such as a printed board or built-up substrate and is used as a semiconductor device (package). An FCBGA (Flipchip Ball Grid Array) package or wafer-level CSP (Chip-Size Package) is known as such a semiconductor device. Various techniques are used to mitigate thermal stress in these packages.

The FCBGA is mainly used in applications that require stable supply of power supply voltage and support of high-speed signals. For example, Patent Document 1 discloses a technique for connecting a semiconductor chip to a BGA substrate using a solder bump and filling the device with an underfill resin in order to protect the small solder-bump connection. In accordance with Patent Document 1, it is possible to provide a highly reliable semiconductor device having a BGA structure in which severance at the solder bump and exfoliation of the semiconductor chip do not occur even if thermal stress is produced by thermal expansion.

Further, a wafer-level CSP formed to have a size substantially the same as that of a semiconductor chip is mainly used in small electronic devices such as mobile telephones and digital cameras. For example, Patent Document 2 discloses a technique for providing a layer having a low elastic modulus on a semiconductor chip and providing an external electrode terminal on this layer. In accordance with Patent Document 2, stress that acts upon metal balls can be mitigated by thus providing the layer having the low elastic modulus below the metal balls. Further, by providing the surface of the semiconductor chip with the metal balls spaced far away from the pads, stress produced in the metal balls can be prevented from propagating to the semiconductor chip connected to the pads.

Further, Patent Document 3 discloses a technique for directly providing a semiconductor element with a wiring layer for the purpose of furnishing a connection reliability greater than that of an FCBGA. In accordance with Patent Document 3, a resin substrate having a highly rigid core material is provided for an external terminal in a semiconductor device incorporating a semiconductor chip, thereby improving the long-term reliability of the package.

[Patent Document 1] Japanese Patent Kokai Publication No. JP-A-11-74417

[Patent Document 2] Japanese Patent Kokai Publication No. JP-A-11-204560

[Patent Document 3] Japanese Patent Kokai Publication No. JP-P2002-246500A

[Patent Document 4] Japanese Patent Kokai Publication No. JP-A-10-51105

[Patent Document 5] Japanese Patent Kokai Publication No. JP-A-9-64493

[Patent Document 6] Japanese Patent Kokai Publication No. JP-A-6-334334

SUMMARY

The entire disclosures of Patent Documents 1-6 are incorporated herein by reference thereto. The following analyses are given by the present inventor.

The related art cited above involves the problems set forth below.

In the technique described in Patent Document 1, breakage is prevented by raising the rigidity of the solder-ball connections through use of underfill resin. Consequently, there is the danger that stress will propagate through the highly rigid wiring layers within the semiconductor chip and that this will lead to severance in fine wiring and at small via holes and to fracturing or peeling of an insulating film that uses a low-k material. Further, in a case where an organic resin having an elastic modulus lower than that of silicon oxide, silicon nitride and silicon oxonitride, etc., is used as the insulating layer in the vicinity of the connections between the semiconductor chip and solder balls where stress concentrates, a large deformation occurs and the wiring layers provided within the insulating layer composed of organic resin sustain a large amount of deformation and migration, which differs for each layer, owing to the respective rigidities and shapes. As a consequence, stress concentrates at the via connections, particularly at the boundaries between the wiring and vias on the side of the semiconductor substrate. In other words, the via structure in Patent Document 1 is one in which the connection interface with the vias is located in a region where stress concentrates.

In the technique described in Patent Document 2, the metal balls are provided spaced far away from the pads in order to prevent stress that develops in the metal balls from propagating to the semiconductor chip connected to the pads. This requires extra space on the surface of the semiconductor chip. In a semiconductor chip for a flipchip package having a large number of terminals, it is difficult to acquire the space needed to distance the metal balls from the pads as well as the space needed to route the wiring patterns for the pads. In other words, this technique is only usable in semiconductor chips such as memories having a small number of pads and cannot be applied to the narrower pitches that result from an increase in number of pads and smaller size brought about by further improvements in functionality.

In the technique described in Patent Document 3, reliability on the side of the external terminals is improved by using a rigid resin material. On the other hand, since thermal expansion produced by embedding semiconductor elements is corrected for on the side of the external terminals by the rigid resin material, the stress released by deformation acts upon the embedded semiconductor chip, the stress concentrates at the vias, which is where the connections are made to the highly rigid metal, and in the terminal portions on the semiconductor elements, and the wiring of the semiconductor elements is severed. Furthermore, since the wiring technique used for the mounting substrate is employed on the semiconductor elements, the design rule of the wiring is enlarged and it is difficult to achieve impedance matching with respect to high-speed signals in the semiconductor elements and to deal with routing involving large numbers of pins having a narrow pitch. In other words, stress, inclusive of stress released by deformation, concentrates at the connections to the semiconductor chip owing to the correction. Furthermore, in the technique described in Patent Document 3, the structure is similar to that of Patent Document 1 in that the connection interface with the vias is situated at the boundary between the wiring and vias on the side of the semiconductor substrate where there is a large concentration of stress.

It is an object of the present invention to provide a highly reliable semiconductor device in which the connection reliability at very small vias is assured.

According to a first aspect of the present invention, there is provided a semiconductor device comprising: a semiconductor substrate; a first wiring structure placed on the semiconductor substrate and having one or more first wiring layers, one or more insulating layers and a first via; a second wiring structure placed on the first wiring structure and having one or more second wiring layers, one or more second insulating layers, a second via and a third via; and an external terminal provided on the second wiring structure; wherein the second via, which is connected to the second wiring layer of the second wiring structure and to the external terminal, has a connection interface disposed at an end of the second via that is on the side of the external terminal.

According to a second aspect of the present invention, there is provided a method of manufacturing a semiconductor device, comprising: forming a first wiring structure, which has a first insulating layer, a first wiring layer and a first via, on a semiconductor substrate on which semiconductor elements have been formed; forming a second wiring structure, which has a second insulating layer, a second wiring layer, a second via and a third via, on the first wiring structure; and forming an external terminal on the second wiring structure; wherein the forming the second wiring structure includes: forming the second wiring layer; forming a metal post, which will serve as the second via, on the second wiring layer; covering the second wiring layer and the metal post with the second insulating layer; and exposing the metal post by polishing the surface of the second insulating layer.

The meritorious effects of the present invention are summarized as follows.

In accordance with the present invention, stress produced in a semiconductor chip can be mitigated by the second wiring structure comprising thick insulating and wiring layers and the very small first wiring structure can be protected. In other words, the second wiring structure, which is obtained by building up the second insulating layers and second wiring layers thicker than the insulating and wiring layers of the first wiring structure using an organic resin as the insulating layers, is provided on the first wiring structure obtained by building up the first wiring layers and first insulating layers alternatingly on the semiconductor substrate. As a result, stress produced in the semiconductor device after mounting on the mounting substrate is effectively mitigated in the second wiring structure and stress that acts upon the first wiring structure can be reduced.

In the second wiring structure in which stress readily concentrates, especially in the vicinity of the external terminals, the amounts of deformation and migration in the respective layers of the plurality of wiring layers, as well as the directions thereof, differ depending upon the shapes and thicknesses of the respective layers and the areas of adhesion to the insulating layers, and stress concentrates at the vias connecting the external electrodes and the wiring layers. In particular, with respect to the vias, stress concentrates at the boundary between the vias and the wiring layers on the side of the semiconductor substrate where the deformation of the resin has a large effect. According to the present invention, a connection interface is provided in the area on the side of the external terminals and not at the boundary with the wiring layer on the side of the semiconductor substrate, and the insulating layers and wiring layers, inclusive of the region of the connection interface, are made to adhere. As a result, the insulating layers are corrected by the wiring layers and similar deformation occurs in the area of adhesion that includes the connection interface with the vias. This makes it possible to achieve an improvement in the connection reliability of the vias. This effect manifests itself in particular with regard to a via diameter of less than 20 µm. Accordingly, it is possible to provide a highly reliable semiconductor device that operates with a large driving current and at a high frequency.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a partial sectional view schematically illustrating the configuration of a semiconductor device according to a first exemplary embodiment of the present invention;

FIG. 2 is an enlarged partial sectional view schematically illustrating the configuration of a first wiring structure in the semiconductor device according to the first exemplary embodiment;

FIGS. 3A and 3B are enlarged partial sectional views useful in describing concentration of stress in a second wiring structure in the semiconductor device according to the first exemplary embodiment;

FIG. 5 is a partial sectional view schematically illustrating the configuration of a second modification of the semiconductor device according to the first exemplary embodiment;

FIGS. 7A to 7E are first process sectional views schematically illustrating a method of manufacturing a semiconductor device according to the first exemplary embodiment;

FIGS. 8A to 8D are second process sectional views schematically illustrating a method of manufacturing a semiconductor device according to the first exemplary embodiment;

FIG. 9 is a partial sectional view schematically illustrating the configuration of a semiconductor device according to a second exemplary embodiment of the present invention;

FIG. 10 is a partial sectional view schematically illustrating the configuration of a semiconductor device according to a third exemplary embodiment of the present invention;

FIGS. 11A to 11E are first process sectional views schematically illustrating a method of manufacturing a semiconductor device according to the third exemplary embodiment; and FIGS. 12A to 12E are second process sectional views schematically illustrating a method of manufacturing a semiconductor device according to the third exemplary embodiment.

PREFERRED MODES OF THE INVENTION

Figure 4:
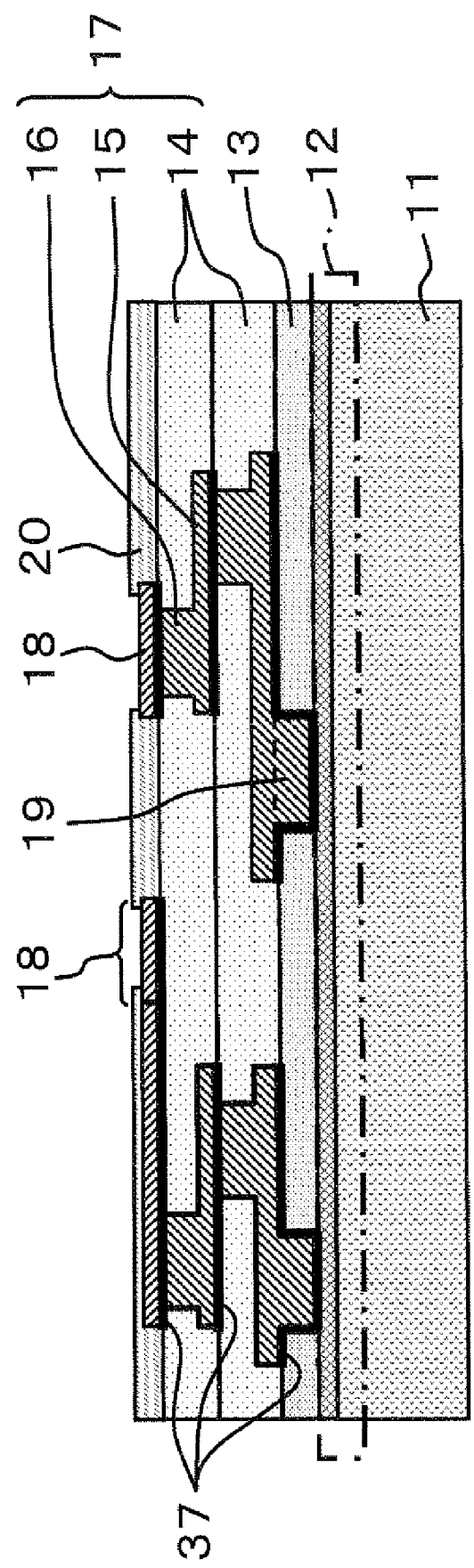
FIG. 4 is a partial sectional view schematically illustrating the configuration of a first modification of the semiconductor device according to the first exemplary embodiment.

A semiconductor device according to the present invention comprises: a semiconductor substrate 11 (FIG. 1); a first wiring structure 12 (FIG. 1) placed on the semiconductor substrate 11 (FIG. 1) and having one or more first wiring layers 26 (FIG. 2), one or more insulating layers 27 (FIG. 2) and a first via 30 (FIG. 2); a second wiring structure 17 (FIG. 1) placed on the first wiring structure 12 (FIG. 1) and having one or more second wiring layers 15 (FIG. 1), one or more second insulating layers 14 (FIG. 1), a second via 16 (FIG. 1) and a third via 19 (FIG. 1); and an external terminal 18 (FIG. 1) provided on the second wiring structure 17 (FIG. 1). The second via 16 (FIG. 1), which is connected to the second wiring layer 15 (FIG. 1) of the second wiring structure 17 (FIG. 1) and to the external terminal 18 (FIG. 1), has a connection interface 16a (FIG. 1) disposed at an end of the second via that is on the side of the external terminal 18 (FIG. 1).

A method of manufacturing a semiconductor device according to the present invention comprises: forming a first wiring structure 12 (FIG. 7), which has a first insulating layer, a first wiring layer and a first via, on a semiconductor substrate 11 (FIG. 7A) on which semiconductor elements have been formed; forming a second wiring structure 17 (FIG. 8D), which has a second insulating layer 14 (FIG. 8D), a second wiring layer 15 (FIG. 8D), a second via 16 (FIG. 8D) and a third via 19 (FIG. 8D), on the first wiring structure 12 (FIG. 7A); and forming an external terminal 18 (FIG. 8D) on the second wiring structure 17 (FIG. 8D). The forming the second wiring structure 17 (FIG. 8D) includes: forming the second wiring layer (which corresponds to electroplating 34 in FIG. 7D); forming a metal post 36 (FIG. 8A), which will serve as the second via 16 (FIG. 8), on the second wiring layer 15 (FIG. 8A); covering the second wiring layer 15 (FIG. 8B) and the metal post 36 (FIG. 8B) with the second insulating layer 14 (FIG. 8B); and exposing the metal post (which corresponds to the second via 16 in FIG. 8C) by polishing the surface of the second insulating layer 14 (FIG. 8C).

Preferred exemplary embodiments of the present invention will now be described with reference to the drawings.

First Exemplary Embodiment

A semiconductor device according to a first exemplary embodiment of the present invention will be described with reference to the drawings, in which FIG. 1 is a partial sectional view schematically illustrating the configuration of a semiconductor device according to a first exemplary embodiment of the present invention, and FIG. 2 is an enlarged partial sectional view schematically illustrating the configuration of a first wiring structure in the semiconductor device according to the first exemplary embodiment.

With reference to FIG. 1, the semiconductor device according to the first exemplary embodiment is provided with a semiconductor substrate 11 on the surface of which a first wiring structure 12 is provided. A second wiring structure 17 is provided on the first wiring structure 12. The semiconductor substrate 11 comprises Si or GaAs, by way of example.

As shown in FIG. 2, the first wiring structure 12 includes source electrodes 22 and drain electrodes 23 formed alternatingly in space-apart relation on the surface of the semiconductor substrate 11. A gate electrode 21 is formed via a gate insulating film (not shown) on a channel region delimited by diffusion areas 22 and 23 (for example, the source electrode 22 and drain electrode 23). A MOS (Metal Oxide Semiconductor) transistor 24 is constructed by the gate electrode 21, source electrode 22 and drain electrode 23. A plurality of the MOS transistors 24 are provided on the semiconductor substrate 11.

A first insulating layer 27 covered by an insulating film 29 is formed on the MOS transistors 24 and on the surface of the semiconductor substrate 11. Plugs 25 connected to the source electrode 22 and drain electrode 23 are formed on the first insulating layer 27 on semiconductor substrate 11. A first wiring layer 26 is provided on the first insulating layer 27. The first wiring layer 26 is composed of wiring 28 and the insulating film 29. The wiring 28 is electrically connected to respective ones of the source electrode 22 and drain electrode 23 by the plugs 25 formed in the first insulating layer 27. The first insulating layer 27 is provided on the first wiring layer 26, and the first wiring layer 26 is provided on the first insulating layer 27. The first insulating layer 27 is composed of the insulating film 29 and a first via 30. The wiring 28 of the first wiring layers 26 above and below the first insulating layer 27 is electrically connected by the corresponding first via 30. The first wiring structure 12 is constructed by building up the first insulating layers 27 and first wiring layers 26 alternatingly.

The wiring 28 and first via 30 of the first wiring structure 12 mainly comprise copper or aluminum, by way of example, and can be formed by, e.g., the damascene method. The damascene method forms a trench in the shape of a desired wiring pattern or via pattern in an insulating film by dry etching, provides a barrier metal by a sputtering method, CVD (Chemical Vapor Deposition) method or ALD (Atomic Layer Deposition) method, etc., then forms a feed layer (not shown), which is for electroplating, by a sputtering method, etc., fills the trench with copper by copper electroplating and then applies a CMP (Chemical Mechanical Polishing) method which leaves the copper only in the trench, thereby providing the desired wiring.

The thickness of the first insulating layer 27 is 0.2 to 1.6 µm, by way of example. Further, among the plurality of first insulating layers 27, at least one first insulating layer 27 provided near the semiconductor substrate 11 preferably uses a low-k material. By way of example, a porous silicon oxide film is used as the low-k material and the elastic modulus thereof at 25° C. is 4 to 10 GPa.

As illustrated in FIG. 1, an insulating passivation film 13 comprising an inorganic or organic material is provided on the first wiring structure 12, and a second wiring layer 15 and second insulating layer 14 are provided on the passivation film. The second wiring layer 15 and wiring 28 (see FIG. 2) on the surface of the first wiring structure 12 are electrically connected via a third via 19. The second wiring structure 17 is constructed by building up the second insulating layers 14 and second wiring layers 15 alternatingly. The plurality of second wiring layers 15 are electrically connected by a second via 16. An external terminal 18 is provided on the second insulating layer 14 that is the uppermost layer. The external terminal 18 is electrically connected to the second wiring layer 15 through the corresponding second via 16. The external terminal 18 may have such a structure that the position thereof is changed depending upon the surface-layer wiring in conformity with the connection method, or such a structure that the terminal is provided directly on the second via 16.

The second wiring layer 15 consists of, e.g., copper, and can have a thickness of 5 µm. The second wiring layer 15 is formed by a wiring formation method different from that of the first wiring structure 12, e.g., a subtractive method, a semi-additive method or a full-additive method. As disclosed in, e.g., Patent Document 4, the subtractive method subjects a copper foil, which has been provided on a substrate or resin, to etching using a resist, which has been formed into a desired pattern, as an etching mask, then removes the resist to obtain the desired wiring pattern. As disclosed in, e.g., Patent Document 5, the semi-additive method forms a feed layer by non-electrolytic plating, a sputtering method or CVD method, etc., then forms a resist having openings into a desired pattern, deposits an electroplating metal in the openings of the resist by electrolysis, removes the resist and then etches the feed layer to obtain the desired wiring pattern. As disclosed in, e.g., Patent Document 6, the full-additive method causes a non-electrolytic plating catalyst to be adsorbed onto the surface of a substrate or resin, then forms a pattern by a resist, activates the catalyst leaving the resist as an insulating layer and deposits a metal in the opening of the insulating layer by a non-electrolytic plating method, thereby obtaining the desired wiring pattern.

Further, an adhesion layer 37 is provided for the second wiring layer 15 and the external terminal 18 on a surface on the side of the semiconductor substrate 11. The adhesion layer 37 is a material that exhibits adhesion with respect to the material constituting the passivation film 13 and second insulating layer 14, e.g., a material such as titanium, tungsten, nickel, tantalum, vanadium, chrome, molybdenum, copper or aluminum or alloys thereof. Among these, titanium, tungsten, tantalum, chrome or molybdenum or alloys thereof are preferred, especially titanium or tungsten or their alloy. Furthermore, the surface of the passivation film 13 or second insulating layer 14 may be a roughened surface having fine unevenness, in which case good adhesion is readily obtained even with copper or aluminum. Formation of the layer by sputtering is ideal as means for improving adhesion. Owing to the fact that the adhesion layer 37 exists between the second via 16 and the external terminal 18 and between second wiring layer 15 and the second insulating layer 14, and the fact that the area of the adhesion layer 37 of the external terminal 18 or second wiring layer 15 is larger than the area of the connection between the second via 16 and the external terminal 18 or between the second wiring layer 15 and the second insulating layer 14, the second insulating layer 14 inclusive of the periphery of the second via is corrected by the external terminal 18 or second wiring layer 15. The external terminal 18 at the periphery of the adhesion layer 37 and the second wiring layer 15, second via 16 and second insulating layer 14 therefore move in approximately the same direction. As a result, the connection interface between the second via 16 and the external terminal 18 or second wiring layer 15 undergoes little deformation and breakage at the connection interface can be prevented effectively even with the second via 16 of very small diameter.

The second wiring layer 15 is formed thicker than the first wiring layer 26 (FIG. 2) of the first wiring structure 12. The thickness of the second wiring layer 15 is, e.g., 3 to 12 µm, preferably 5 to 10 µm. If the thickness is less than 3 µm, the wiring resistance will be high and the electrical characteristics of the power supply circuit of the semiconductor device will deteriorate. A wiring layer whose thickness exceeds 12 µm will produce waviness, which reflects the unevenness of the wiring layer, in the surface of the insulating layer that covers the wiring layer, limits the number of layers built up, increases the thickness of the second wiring structure 17 per se, enlarges the warpage of the overall semiconductor device and makes formation difficult owing to process-related limitations.

The second insulating layer 14 is formed from, e.g., an organic material. Examples are epoxy resin, epoxy acrylate resin, urethane acrylate resin, polyester resin, phenol resin, polyimide resin, BCB (benzocyclobutene), PBO (polybenzoxazole) and polynorbornene resin, etc. In particular, polyimide resin and PBO excel in such mechanical characteristics as film strength, tensile elastic modulus and breakage elongation and therefore can furnish high reliability. It does not matter whether the organic material is photosensitive or non-photosensitive. By using an organic material for the second insulating layer 14, stress that acts upon the semiconductor device from the external terminal 18 when the semiconductor device is mounted on the mounting substrate is mitigated mainly by deformation of the second insulating layer 14, and propagation of stress to the first wiring structure 12 can be reduced effectively.

The elastic modulus of the second insulating layer 14 at 25° C. is, e.g., 0.15 to 8 GPa. If the elastic modulus is less than 0.15 GPa, the amount of deformation of the second insulating layer 14 when stress is mitigated is large, almost all of the stress is impressed upon the second wiring layer 15, the second wiring layer 15 is readily severed and breakage readily occurs at the interface of the second wiring layer 15/second via 16. If the elastic modulus exceeds 8 GPa, the amount of deformation of the second insulating layer 14 is too small, mitigation of stress in the second wiring structure 17 is unsatisfactory and exfoliation between layers and destruction of the insulating film readily occur in the first wiring structure 12. Accordingly, an elastic modulus of 0.15 to 8 GPa is preferred. Further, by adopting a combination in which the elastic modulus of the second insulating layer 14 of second wiring structure 17 is lower than that of the first insulating layer 27 (FIG. 2) of first wiring structure 12, stress is mitigated effectively by the second insulating layer 14 and the first wiring structure 12 can be protected.

Further, the breakage elongation of the second insulating layer 14 is equal to or greater than 15%. If the breakage elongation is less than 15%, cracks readily develop in the second insulating layer 14. For example, when the semiconductor device according to the first exemplary embodiment was mounted on a mounting substrate and subjected to a temperature cycle test at −55 to 125° C., cracks were produced in the second insulating layer 14 by 100 to 300 cycles. Accordingly, it is preferred that the breakage elongation be equal to or greater than 15%.

Furthermore, in a case where the second insulating layer 14 has an elastic modulus equal to or greater than 1.5 GPa at 25° C., for example, it is preferred that the coefficient of thermal expansion be less than 40 ppm/° C. If the coefficient of thermal expansion exceeds 40 ppm/° C., the wafer that forms the semiconductor device will warp owing to internal stress of the second insulating layer 14. In a silicon wafer having a diameter of 200 mm (8 inches) and a thickness of 0.725 mm, this amount of warpage exceeds 200 µm in a case where the thickness of the overall insulating layer is in the vicinity of 30 to 35 µm. This becomes a problem in subsequent polishing of the underside of the silicon wafer and in a chip formation step such as dicing. By making the coefficient of thermal expansion less than 20 ppm/° C., the amount of warpage of the chip can be reduced and it is possible to enlarge the thickness of the overall insulating film. It should be noted that if the elastic modulus of the second insulating layer 14 at 25° C. is less than 1.5 GPa, the warpage of the wafer will be less than 200 µm with the overall thickness of the insulating film in the vicinity of 30 to 35 µm, irrespective of the value of the coefficient of thermal expansion.

A connection interface 16a is disposed at the end of the second via 16 that is on the side of the external terminal 18. With the structure having the connection interface 16a at the end of the second via 16 on the side of the external terminal 18, interfacial breakage between the second via 16 and the second wiring layer 15 in the second wiring structure 17 and between it and the external terminal 18 can be prevented more effectively in comparison with a structure having the connection interface at the end of the second via 16 on the side of the semiconductor substrate 11, namely a structure having the connection interface at the boundary between the second via 16 and the second wiring layer 15 on the side of the semiconductor substrate. With a semiconductor device having the second wiring structure 17 with the organic resin, when stress develops following mounting on the mounting substrate, the deformation of the second insulating layer 14 having a low elastic modulus deforms more than the highly rigid second wiring layer 15 and stress concentrates at the second via 16 connecting a plurality of the second wiring layers 15. This concentration of stress is as illustrated in FIGS. 3A and 3B. By connecting the semiconductor device to the mounting substrate, the stand-alone state shown in FIG. 3A becomes the state shown in FIG. 3B, in which external stress indicated by the arrow is received. Under this condition of received external stress, the direction of deformation and amount thereof in each layer vary owing to a difference in the patterns of the external terminal 18 and second wiring layer 15. Further, since the second insulating layer 14 is strongly joined to the external terminal 18 or to second wiring layer 15 by the adhesion layers 37, wiring correction areas 38 shown in FIGS. 3A, 3B are produced in the second insulating layer 14. In the wiring correction areas 38, the second insulating layer 14 has its deformation corrected by the external terminal 18 or second wiring layer 15 and the deformation follows the respective patterns. As a result, stress does not concentrate at the connection interface of the second via 16.

On the other hand, at the boundary between the second wiring layer 15 and the end portion of the second via 16 on the side of the semiconductor substrate 11 where the force of the second wiring layer 15 with respect to the second insulating layer 14 weakens, a stress concentration area 39 is produced owing to deformation of the second insulating layer 14 and rigidity of the second wiring layer 15. Thus, owing to the structure having the connection interface 16a (see FIG. 1) at the end of the second via 16 that is on the side of the external terminal 18, breakage at the connection interface of the second via 16 can be prevented. In particular, connection reliability can be improved at a second via 16 having a diameter of less than 20 µm. At the boundary between the second wiring layer 15 and the end of the second via 16 on the side of the semiconductor substrate 11, the adhesion layer 37 does not exist and the second wiring layer 15 and second via 16 are integrated. As for the integrated state, the fact that there is no interface that invites breakage at the stress concentration area 39 is ideal. Also ideal is that grain boundary of the material constituting the second wiring layer 15 and second via 16 is not provided so as to cross the second via 16 in a plane in the stress concentration area 39.

In order to place the connection interface 16a of the second via 16 on the side of the external terminal, use is made of a method of forming a post at the position of the second via 16 beforehand by a plating method or forming the post and wiring by performing etching after full-surface plating, then forming an insulating film of an organic material, polishing and exposing the post to thereby obtain the second via 16. With the plating method, the oxide on the surface of the underlying metal is removed by a pre-treatment, and epitaxial growth that follows the grain boundary of the underlying metal occurs when the initial deposition of plating metal is performed. As a result, the second wiring layer 15 and second via 16 finally constructed become an integrated whole even though the process is divided. This makes it possible to avoid a state in which the grain boundary crosses the plane.

The external terminal 18 may have the structures shown in FIGS. 4 and 5. In FIG. 4, if connection is achieved using a solder material, an opening is limited by an overcoat film 20 so as to obtain a state in which solder is supplied solely to the external terminal 18. Since the amount of solder flow is limited owing to the limitation applied by the overcoat film 20, it is possible to stabilize mounting height when the semiconductor device is mounted on the mounting substrate. Further, with the structure shown in FIG. 5, the second via 16 for making the connection to the external terminal 18 is exposed in the opening of the overcoat film 20, and the external terminal 18 is provided so as to cover the exposed portion of the second via 16 and the opening in the overcoat film 20. By adopting the structure of FIG. 5, concentration of stress at the external terminal 18 can be dissipated more effectively. The overcoat film 20 is formed from, e.g., epoxy resin, epoxy acrylate resin, urethane acrylate resin, polyester resin, phenol resin, polyimide resin, BCB (benzocyclobutene), PBO (polybenzoxazole) and polynorbornene resin, etc. In particular, polyimide resin and PBO excel in such mechanical characteristics as film strength, tensile elastic modulus and breakage elongation and therefore can furnish high reliability. It does not matter whether the organic material is photosensitive or non-photosensitive. In a case where a photosensitive organic material is used, the opening in the overcoat film 20 is formed by photolithography or the like. In a case where use is made of a photosensitive or non-photosensitive organic material with a low pattern resolution, the opening in the overcoat film 20 is formed by laser, dry etching or blasting, etc.

The surface of the external terminal 18 can be formed by at least one metal selected from the group comprising, e.g., copper, aluminum, gold, silver and solder material, or an alloy thereof, taking into consideration the wetness of solder balls formed on the surface of the external terminal 18 and the connectivity of bonding wires, etc. Further, the external terminal 18 can be constructed by building up a plurality of layers. For example, a nickel layer and a gold layer can be built up on a copper layer, the gold layer can be adopted as the surface, and the thicknesses of the nickel layer and gold layer can be made 3 μm and 1 μm, respectively.

In FIG. 1, the second insulating layer 14 and the second wiring layer 15 are illustrated as two layers each. However, this does not impose a limitation and the number of layers used may decided as necessary. Further, in FIG. 2, there are eight layers of the first wiring layer 26 and seven layers of the first insulating layer 27. However, this does not impose a limitation and the number of layers used may decided as necessary.

Further, the wiring of the first wiring layer 26 and second wiring layer 15 is composed of at least one metal selected from the group comprising, e.g., copper, aluminum, nickel, gold and silver. In particular, copper is ideal from the standpoints of electrical resistance value and cost. Further, nickel makes it possible to prevent an interfacial reaction with another material such as the insulating material and can be used as an inductor or resistance wiring that exploits the characteristics of a magnetic material.

Figure 6A:
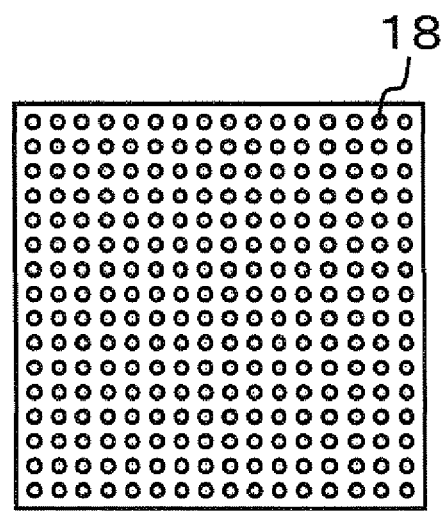
FIGS. 6A to 6C are schematic views illustrating an example of the effects of a reduction in external terminals in the semiconductor device according to the first exemplary embodiment.
Figure 6B:
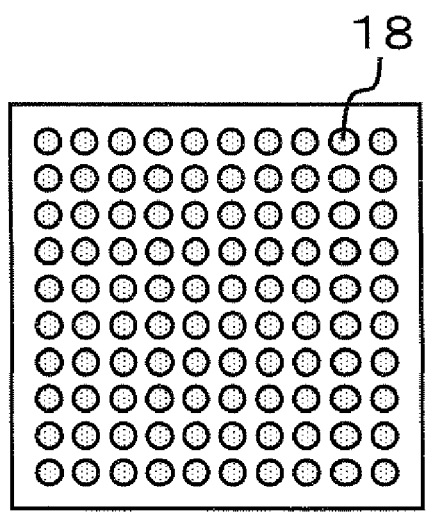
Figure 6C:
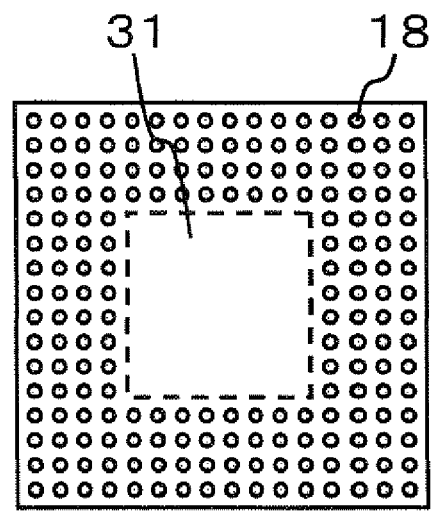

The thickness of the second wiring layer 15 of second wiring structure 17 is two or more times the thickness of the first wiring layer 26 of first wiring structure 12, and therefore it has an allowable amount of current that is at least two or more times greater. In the second wiring layer 15 of second wiring structure 17, therefore, a plurality of power wires or ground wires using identical voltage can be bundled together into a single wire. By gathering the plurality of wires together into a single wire, the result is as illustrated in the examples of FIGS. 6B and 6C and the number of external terminals 18 can be made less than the number of electrical connections with the second wiring structure 17 formed on the surface of the first wiring structure 12. By reducing the number of external terminals 18, the result is as illustrated in FIG. 6B. In comparison with the case of FIG. 6A, in which the reduction has not been made, the size and spacing (pitch) of the external terminals 18 can be enlarged. As a result, the area of connection between the mounting substrate and the semiconductor device is enlarged and it is possible to realize stable packaging and high connection reliability. Further, as illustrated in FIG. 6C, if use is made of a size and spacing (pitch) of the external terminals 18 identical with those of the case where no reduction in the number of external terminals is made, a vacant area 31, in which it is possible to mount other passive elements, active elements and optical element, etc., is obtained on the surface on which the external terminals are formed. Further functionality and higher performance can be realized by mounting other parts. Naturally, in a case where other parts are mounted, external terminals 18 for connecting the parts are provided at desired positions within the vacant area 31. By enabling a reduction in the number of vias, not only can the danger of breakage at the vias be reduced but it is also possible to enlarge via diameter. This enables a greater improvement in via connection reliability.

Next, a method of manufacturing the semiconductor device according to the first exemplary embodiment of the present invention will be described with reference to the drawings. FIGS. 7A to 7E and FIGS. 8A to 8D are process sectional views schematically illustrating a method of manufacturing a semiconductor device according to the first exemplary embodiment. It should be noted that it does not matter if washing and heat treatment are performed at each step as appropriate.

First, the first wiring structure 12 is formed on the semiconductor substrate 11 (step A1; FIG. 7A). The semiconductor substrate 11 is formed of Si or GaAs, and a plurality of MOS (Metal Oxide Semiconductor) transistors 24 are formed. In each MOS transistor 24, the gate electrode 21 is formed via a gate insulating film (not shown) on a channel region delimited by the source electrode 22 and drain electrode 23, as illustrated in FIG. 2. In the first wiring structure 12, copper or aluminum, for example, is mainly used for the wiring 28 and first vias 30 of the first wiring layer, and these are formed by e.g., the damascene method. The damascene method forms a trench in the shape of a desired wiring pattern or via pattern in an insulating film by dry etching, provides a barrier metal by a sputtering method, CVD (Chemical Vapor Deposition) method or ALD (Atomic Layer Deposition) method, etc., then forms a feed layer, which is for electroplating, by a sputtering method, etc., fills the trench with copper by copper electroplating and then applies a CMP (Chemical Mechanical Polishing) method which leaves the copper only in the trench, thereby providing the desired wiring. Further, among the plurality of first insulating layers 27, the insulating film 29 of at least one first insulating layer 27 provided near the semiconductor substrate 11 preferably uses a low-k material. By way of example, a porous silicon oxide film is used as the low-k material. The first insulating layer 27 is formed by the CVD method or by a spin coating method.

Next, the passivation film 13 is formed (step A2; FIG. 7B). If the passivation film 13 is an inorganic material, an opening is formed by dry etching so as to expose the connection to the first wiring structure 12 after the passivation film 13 is formed by the CVD method or spin coating method. If the passivation film 13 is an organic material, then it does not matter whether the material is photosensitive or non-photosensitive. If a photosensitive organic material is used, the opening in the passivation film 13 is formed as by photolithography after the passivation film 13 is formed by spin coating, a laminate method, pressing method or printing method. In a case where use is made of a photosensitive or non-photosensitive organic material with a low pattern resolution, the opening in the passivation film 13 is formed by laser, dry etching or blasting, etc.

It should be noted that FIGS. 7A to 7E and FIGS. 8A to 8D illustrate the opening in the passivation film 13 as having a vertical wall, as in FIG. 1, etc. However, the wall may be tapered, as illustrated in FIG. 9 (according to a second exemplary embodiment). By tapering the opening, the area of connection with the first wiring structure 12 can be reduced. This makes it possible to raise the wiring density on the surface of the first wiring structure 12 and to enlarge the area of connection with the second wiring layer 15, thereby improving connection reliability. In addition, formation of the wiring is facilitated by tapering the opening.

Next, a feed layer 32 is formed by sputtering, non-electrolytic plating, the CVD method or aerosol method, etc. (step A3; FIG. 7C). The feed layer 32 is formed so as to contact the passivation film 13 and second insulating layer 14. In particular, the sputtering method is ideal since it readily assures adhesion to the material of the passivation film 13 and second insulating layer 14, etc. The feed layer 32 is formed from a laminate of an adhesion metal and low-resistance metal for electroplating purposes. Suitable examples of the adhesion metal are titanium, tungsten, nickel, tantalum, vanadium, chrome, molybdenum, copper or aluminum or alloys thereof. Among these, titanium, tungsten, tantalum, chrome or molybdenum or alloys thereof are preferred, especially titanium or tungsten or their alloy. Furthermore, the surface of the passivation film 13 or second insulating layer 14 may be a roughened surface having fine unevenness, in which case good adhesion is readily obtained even with copper or aluminum. Formation of the layer by sputtering is ideal as means for improving adhesion. Applying reverse sputtering using argon is particular preferred as a pre-treatment for film formation by sputtering.

Next, a plating resist 33 is formed on the feed layer 32 and an electroplating metal 34 is deposited in the opening of the plating resist 33 by supplying electricity to the feed layer 32 (step A4; FIG. 7D). The plating resist 33, which consists of a photosensitive organic material, is formed into a film by the spin coating method, laminate method, pressing method or printing method, after which the opening is formed in the plating resist 33 as by photolithography.

Next, plating resist 33 is formed so to have an opening at a position where the second via 16 will be situated, and an electroplating metal 35 is deposited in this opening by supplying electricity to the feed layer 32 (step A5; FIG. 7E). This plating resist 33 may be formed by building it up on the plating resist 33 that was formed at step 7D or may be formed anew. Further, the plating resist 33, which consists of a photosensitive organic material, is formed into a film by the spin coating method, laminate method, pressing method or printing method, after which the opening is formed in the plating resist 33 as by photolithography. In the plating method, the oxide on the surface of the underlying metal is removed by a pre-treatment, and epitaxial growth that follows the grain boundary of the underlying metal occurs when the initial deposition of plating metal is performed. As a result, the second wiring layer 15 and second via 16 finally constructed become an integrated whole even though the process is divided. This makes it possible to avoid a state in which the grain boundary crosses the plane.

Next, the plating resist 33 is removed, the feed layer 32 is removed by wet etching or dry etching, and the second wiring layer 15 that is an integral part of a metal post 36 that will serve as the second via 16 (FIG. 1) is formed (step A6; FIG. 8A).

Next, the second insulating layer 14 is formed by the spin coating method, laminate method, pressing method or printing method so as to cover the second wiring layer 15 and metal post 36 (step A7; FIG. 8B). The second insulating layer 14 is formed from epoxy resin, epoxy acrylate resin, urethane acrylate resin, polyester resin, phenol resin, polyimide resin, BCB (benzocyclobutene), PBO (polybenzoxazole) or polynorbornene resin, etc. In particular, polyimide resin and PBO excel in such mechanical characteristics as film strength, tensile elastic modulus and breakage elongation and therefore can furnish high reliability.

Next, the surface of the second insulating layer 14 is removed by the dry etching method, CMP method, polishing or lapping and the upper portion of the metal post 36 (FIG. 8B) formed by plating is exposed to thereby form the second via 16 (step A8; FIG. 8C). By adopting this method, stable formation of the second via 16 is more easily verified, owing to exposure of the connection surface of the second via 16, in comparison with the generally employed method of via-hole formation, and cleaning of the connection interface also can be performed more reliably. In terms of surface flatness and machining speed, CMP is ideal as the polishing method.

Next, the second wiring structure 17 having the desired number of layers is formed by repeating the steps of FIGS. 7C to 8C, then the external terminals 18 are formed (step A9; FIG. 8D) using the feed layer 32, plating resist 33, electrolytic plating, non-electrolytic plating and etching methods through steps similar to those of FIGS. 7C to 8C.

In accordance with the method of manufacturing the semiconductor device illustrated in FIGS. 7A to 7E and FIGS. 8A to 8D, the semiconductor device shown in FIG. 1 can be formed very efficiently. In addition, a plurality of semiconductor devices may be formed on a wafer and separated into individual devices by dicing.

The effects set forth below are obtained in accordance with the first exemplary embodiment.

With reference to FIG. 1, in a case where the external terminal 18 of the semiconductor device is provided with a solder ball and the device is mounted on a mounting substrate (not shown), stress that acts upon the semiconductor device owing to a mismatch in coefficients of thermal expansion between the mounting substrate and the semiconductor device is mitigated owing to deformation of the second insulating layer 14 of second wiring structure 17. Furthermore, by placing the connection interface 16a on the side of the external terminal 18 (of the second via 16), the connection interface can be separated from the boundary between the second via 16 and the second wiring layer 15 on the side of the semiconductor substrate 11 where stress concentrates and the connection reliability of the second via 16 can be improved.

Further, by making the thickness of the second wiring layer 15 of second wiring structure 17 two or more times the thickness of the first wiring layer 26 of first wiring structure 12, breakage of the second wiring layer 15 can be prevented and the wiring resistance of the second wiring layer 15 can be reduced. Furthermore, if the thickness of the second wiring layer 15 is enlarged, then the thickness per layer of the second insulating layers 14 increases correspondingly and the effect of mitigating stress is enhanced.

Furthermore, if the thickness of the second wiring layer 15 is two or more times greater, then it will have an allowable amount of current that is at least two or more times greater than that of the first wiring layer 26 of first wiring structure 12. In the second wiring structure 17, therefore, power wires or ground wires using identical voltage can be bundled together into a single wire. In wafer-level CSP that performs rewiring on the surface of a semiconductor element, only the placement is changed in a one-to-one relationship without reducing the number of connection terminals of the wiring when provided on the semiconductor device element. The numbers of power and ground terminals are increased over those of a semiconductor element the number of external terminals of which is about 500 or more. In particular, in the case of a semiconductor element having about 1500 external terminals or more, about 60 to 80% of the number of pins will be power and ground terminals in order to maintain the performance of the element. By gathering the power wiring and ground wiring together, the number of external terminals 18 can be reduced greatly in comparison with a case where the same number of external terminals 18 is formed in a one-to-one relationship with respect to the points of electrical contact with the second wiring structure 17 formed on the surface of the first wiring structure 12. As a result, since the size and spacing (pitch) of the external terminals 18 can be enlarged, stable packaging of the mounting substrate and semiconductor device and high connection reliability can be realized.

If use is made of a size and spacing (pitch) of the external terminals 18 identical with those of the case where no reduction in the number of external terminals is made, a surface area, in which it is possible to mount other passive elements, active elements and optical element, etc., is obtained on the surface on which the external terminals 18 are formed. Effects obtained are a reduction in number of vias and enlargement of via diameter. As a result, it is possible to achieve a reduction in number of vias, where the danger of breakage is high, and an improvement in connection area. This makes it possible to enhance connection reliability. Further, by mounting other parts, increased functionality and higher performance can be realized.

Furthermore, by reducing the number of external terminals 18 and changing their placement, it is possible to use a common substrate in which the functions of the connection terminals of the mounting board on which the semiconductor device is mounted have been divided beforehand into power, ground and signal functions. This enables a major reduction in cost. If the positions of the external terminals 18 for power, ground and signals differ for every semiconductor element, a mounting substrate corresponding to each is required, and this invites a large increase in cost in the case of a packages of many types manufactured in small quantities, as in the case of FCBGA. This means that the connection reliability of small vias with respect to the second wiring structure 17 is improved, that propagation of stress to the first wiring structure 12 can be reduced effectively and that a semiconductor device having a high reliability when mounted can be achieved. Accordingly, it is possible to provide a highly reliable semiconductor device that operates at a high frequency and with a large driving current owing to use of the second wiring structure 17.

Second Exemplary Embodiment

A semiconductor device according to a second exemplary embodiment of the present invention will be described with reference to the drawings. FIG. 9 is a partial sectional view schematically illustrating the configuration of a semiconductor device according to a second exemplary embodiment of the present invention.

The semiconductor device according to the second exemplary embodiment differs from that of the first exemplary embodiment (see FIG. 1) in that the third via 19, which electrically connects the first wiring structure 12 and second wiring structure 17 provided on the passivation film 13, has a larger taper angle than that of the second via 16. In other aspects this exemplary embodiment is similar to the first exemplary embodiment. It should be noted that although the structure of the external terminal 18 in FIG. 9 is similar to that of FIG. 1, the external terminal 18 may just as well have a structure identical with that shown in FIGS. 4 and 5. Furthermore, the second exemplary embodiment similarly has the effect of reducing the number of external terminals 18 by gathering together the power wiring and ground wiring illustrated in FIGS. 6B and 6C.

Let a represent the cross-sectional area of the surface of connection between the third via 19 and the first wiring structure 12, let b represent the cross-sectional area of the third via 19 on the extension line of the surface of connection between the passivation film 13 and the second wiring layer 15, let c represent the cross-sectional area at the boundary between the second via 16 of the second wiring structure 17 and the second wiring layer 15 on the side of the semiconductor substrate 11, and let d represent the cross-sectional area of the connection interface on the side of the external terminal 18. In this case, the structure is as indicated by Equation (1) below.

$$b/a > d/c \qquad \text{Equation (1)}$$

This means that the third via 19 has a taper angle larger than that of the second via 16. In the semiconductor device according to the second exemplary embodiment, the structure is such that the design rule of the wiring becomes gradually larger in the direction from the side of the semiconductor substrate 11 to the side of the external terminal 18. This is important in order to enable mounting on the mounting substrate and incorporate the semiconductor device into a system.

By providing the third via 19 with taper angle, wiring design can be enlarged from the first wiring structure 12 to the second wiring structure 17. In other words, by reducing the cross-sectional area of the third via 19 on the side of the first wiring structure 12, the area of connection between the first wiring structure 12 and the upper wiring can be reduced. By further reducing the area of connection, wiring density can be raised.

Further, by enlarging the cross-sectional area of the second wiring layer 15 on the side of the boundary, adjustment is possible without making a conversion to the design rule of the second wiring structure 17 within the same wiring layer. On the other hand, in the case of the second via 16, since it is necessary to raise the wiring density of the second wiring structure 17, it is preferred that the taper angle at least be made smaller than that of the third via 19, and the shape of a substantially cubic column or substantially cylindrical column is desirable.

Further, by tapering the third via 19, stress that has been mitigated in the second wiring structure 17 can be transferred to the passivation film 13 efficiently. As a result, better protection can be provided for the first wiring structure 12.

In a case where the third via 19 is formed to have the taper angle, formation is possible by applying lithography and thermal treatment using a photosensitive organic material as the passivation film 13; by performing wet etching of an organic material of a non-photosensitive resin using another material as a mask, followed by heat treatment; by performing anisotropic etching using dry etching or wet etching; or by first forming an electrically conductive post or bump that will serve as the third via 19.

In accordance with the second exemplary embodiment, effects similar to those of the first exemplary embodiment are obtained and, in addition to the effect of mitigating stress in the second wiring structure 17, the effect of mitigating stress in the passivation film 13 is obtained as well. As a result, the ability to protect the first wiring structure 12 is enhanced further and a highly reliable semiconductor device can be obtained.

Third Exemplary Embodiment

A semiconductor device according to a third exemplary embodiment of the present invention will be described with reference to the drawings. FIG. 10 is a partial sectional view schematically illustrating the configuration of a semiconductor device according to a third exemplary embodiment of the present invention.

The semiconductor device according to the third exemplary embodiment differs from the semiconductor devices according to the first exemplary embodiment (FIG. 1) and second exemplary embodiment (FIG. 9) in that the third via 19 that electrically connects the first wiring structure 12 and the second wiring structure 17 to the passivation film 13 is provided separate from the second wiring layer 15, and in that the adhesion layer 37 is provided between the third via 19 and the second wiring layer 15. In other aspects this exemplary embodiment is similar to the first exemplary embodiment. It should be noted that although the structure of the external terminal 18 in FIG. 10 is similar to that of FIG. 1, the external terminal 18 may just as well have a structure identical with that shown in FIGS. 4 and 5. Furthermore, the third exemplary embodiment similarly has the effect of reducing the number of external terminals 18 by gathering together the power wiring and ground wiring illustrated in FIGS. 6B and 6C. Furthermore, as illustrated in FIG. 9, it does not matter if the third via 19 of the passivation film 13 has a taper angle larger than that of the second via 16.

Since the third via 19 is provided in the passivation film 13, the step in the surface of the passivation film 13 can be made smaller in comparison with that of the semiconductor devices of the first and second exemplary embodiments when the second wiring layer 15 is formed, and it is easier to make the second wiring layer 15 finer and to raise the density thereof in comparison with that of the semiconductor devices of the first and second exemplary embodiments.

The third via 19 is made from at least one metal selected from the group comprising tungsten, nickel, copper, gold, aluminum and silver and is provided in the passivation film 13. The third via 19 may be formed by providing an opening in the passivation film 13 and then filling the opening with the desired metal. After the third via 19 is provided on the first wiring structure 12, surface polishing may be performed following formation of the passivation film 13.

Next, a method of manufacturing the semiconductor device according to the third exemplary embodiment of the present invention will be described with reference to the drawings. FIGS. 11A to 1E and FIGS. 12A to 12E are process sectional views schematically illustrating a method of manufacturing a semiconductor device according to the third exemplary embodiment. It should be noted that it does not matter if washing and heat treatment are performed at each step as appropriate.

First, the first wiring structure 12 is formed on the semiconductor substrate 11 (step B1; FIG. 11A). The semiconductor substrate 11 is formed of Si or GaAs, and a plurality of MOS (Metal Oxide Semiconductor) transistors 24 are formed. In each MOS transistor 24, the gate electrode 21 is formed via a gate insulating film (not shown) on a channel region delimited by the source electrode 22 and drain electrode 23, as illustrated in FIG. 2. In the first wiring structure 12, copper or aluminum, for example, is mainly used for the wiring 28 and first vias 30 of the first wiring layer, and these are formed by e.g., the damascene method. The damascene method forms a trench in the shape of a desired wiring pattern or via pattern in an insulating film by dry etching, provides a barrier metal by a sputtering method, CVD (Chemical Vapor Deposition) method or ALD (Atomic Layer Deposition) method, etc., then forms a feed layer, which is for electroplating, by a sputtering method, etc., fills the trench with copper by copper electroplating and then applies a CMP (Chemical Mechanical Polishing) method which leaves the copper only in the trench, thereby providing the desired wiring. Further, among the plurality of first insulating layers 27, the insulating film 29 of at least one first insulating layer 27 provided near the semiconductor substrate 11 preferably uses a low-k material. By way of example, a porous silicon oxide film is used as the low-k material. The first insulating layer 27 is formed by the CVD method or by a spin coating method. The third via 19 is formed from at least one metal selected from the group comprising tungsten, nickel, copper, gold, aluminum and silver. As for the method of forming the third via 19, a desired metal film is formed over the entire surface by the CVD method, sputtering method, electroplating or non-electroplating. Thereafter, the third via 19 may be formed by dry etching or wet etching, or a metal may be deposited at the desired position using a plating resist.

Next, the passivation film 13 is formed (step B2; FIG. 11B). If the passivation film 13 is an inorganic material, the passivation film 13 is formed by the CVD method or spin coating method. If the passivation film 13 is an organic material, the material may be either photosensitive or non-photosensitive, and the passivation film 13 is formed by spin coating, the laminate method, pressing method or printing method.

Next, the passivation film 13 is removed by the dry etching method, CMP method, polishing or lapping and the upper portion of the third via 19 is exposed (step B3; FIG. 11C).

It should be noted that FIGS. 11A to 11C illustrate a method of forming the third via 19 before the passivation film 13 is formed. However, as illustrated in FIG. 7B, after the passivation film 13 is formed, the opening may be filled with the desired metal, after which excess metal may be removed by etching or by the CMP method.

Further, FIGS. 11A to 11E and FIGS. 11A to 11D illustrate the opening in the passivation film 13 as having a vertical wall, as in FIG. 1. However, the wall may be tapered, as illustrated in FIG. 9 (according to the second exemplary embodiment). By tapering the opening, the area of connection with the first wiring structure 12 can be reduced. This makes it possible to raise the wiring density on the surface of the first wiring structure 12 and to enlarge the area of connection with the second wiring layer 15, thereby improving connection reliability. In addition, formation of the wiring is facilitated by tapering the opening.

Next, the feed layer 32 is formed by sputtering, non-electrolytic plating, the CVD method or aerosol method, etc. (step B4; FIG. 11D). In particular, the sputtering method is ideal since it readily assures adhesion to the material of the passivation film 13 and second insulating layer 14, etc. The feed layer 32 is formed from a laminate of an adhesion metal and low-resistance metal for electroplating purposes. Suitable examples of the adhesion metal are titanium, tungsten, nickel, tantalum, vanadium, chrome, molybdenum, copper or aluminum or alloys thereof. Among these, titanium, tungsten, tantalum, chrome or molybdenum or alloys thereof are preferred, especially titanium or tungsten or their alloy. Furthermore, the surface of the passivation film 13 or second insulating layer 14 may be a roughened surface having fine unevenness, in which case good adhesion is readily obtained even with copper or aluminum. Formation of the layer by sputtering is ideal as means for improving adhesion. Applying reverse sputtering using argon is particular preferred as a pre-treatment for film formation by sputtering.

Next, the plating resist 33 is formed on the feed layer 32 and an electroplating metal 34 is deposited in the opening of the plating resist 33 by supplying electricity to the feed layer 32 (step B5; FIG. 11E). The plating resist 33, which consists of a photosensitive organic material, is formed into a film by the spin coating method, laminate method, pressing method or printing method, after which the opening is formed in the plating resist 33 as by photolithography.

Next, the plating resist 33 is formed so as to have an opening at a position where the second via 16 will be situated, and an electroplating metal 35 is deposited in this opening by supplying electricity to the feed layer 32 (step B6; FIG. 12A). This plating resist 33 may be formed by building it up on the plating resist 33 that was formed at step 11E or may be formed anew. Further, the plating resist 33, which consists of a photosensitive organic material, is formed into a film by the spin coating method, laminate method, pressing method or printing method, after which the opening is formed in the plating resist 33 as by photolithography. In the plating method, the oxide on the surface of the underlying metal is removed by a pre-treatment, and epitaxial growth that follows the grain boundary of the underlying metal occurs when the initial deposition of plating metal is performed. As a result, the second wiring layer 15 and second via 16 finally constructed become an integrated whole even though the process is divided. This makes it possible to avoid a state in which the grain boundary crosses the plane.

Next, the plating resist 33 is removed, the feed layer 32 is removed by wet etching or dry etching, and the second wiring layer 15 that is an integral part of a metal post 36 that will serve as the second via 16 is formed (step B7; FIG. 12B).

Next, the second insulating layer 14 is formed by the spin coating method, laminate method, pressing method or printing method so as to cover the second wiring layer 15 and metal post 36 (step B8; FIG. 12C). The second insulating layer 14 is formed from epoxy resin, epoxy acrylate resin, urethane acrylate resin, polyester resin, phenol resin, polyimide resin, BCB (benzocyclobutene), PBO (polybenzoxazole) or polynorbornene resin, etc. In particular, polyimide resin and PBO excel in such mechanical characteristics as film strength, tensile elastic modulus and breakage elongation and therefore can furnish high reliability.

Next, the surface of the second insulating layer 14 is removed by the dry etching method, CMP method, polishing or lapping and the upper portion of the metal post 36 (FIG. 8B) formed by plating is exposed to thereby form the second via 16 (step B9; FIG. 12D). By adopting this method, stable formation of the second via 16 is more easily verified, owing to exposure of the connection surface of the second via 16, in comparison with the generally employed method of via-hole formation, and cleaning of the connection interface also can be performed more reliably. In terms of surface flatness and machining speed, CMP is ideal as the polishing method.

Next, the second wiring structure 17 having the desired number of layers is formed by repeating the steps of FIGS. 11D to 12D, then the external terminals 18 are formed (step B10; FIG. 12E) using the feed layer 32, plating resist 33, electrolytic plating, non-electrolytic plating and etching methods through steps similar to those of FIGS. 11D to 12B.

In accordance with the method of manufacturing the semiconductor device illustrated in FIGS. 11A to 11E and FIGS. 12A to 12D, the semiconductor device shown in FIG. 10 can be formed very efficiently. By forming the third via 19, the second wiring layer 15 on the passivation film 13 can be formed finer and at a higher density in comparison with the method of manufacturing the semiconductor device according to the first exemplary embodiment. In addition, a plurality of semiconductor devices may be formed on a wafer and separated into individual devices by dicing.

In accordance with the third exemplary embodiment, effects similar to those of the first and second exemplary embodiments are obtained and the second wiring layer 15 provided on the passivation film 13 can be made finer and higher in density.

In the first to third exemplary embodiments, a capacitor that performs the role of a circuit noise filter may be provided at desired position of the laminate circuit composed of the surface of the first wiring structure 12, the passivation film 13, second insulating layer 14, second wiring layer 15, external terminal 18 and overcoat film 20. Preferred as the dielectric material for forming the capacitor are metal oxides such as titanium oxide, tantalum oxide, $Al_2O_3$, $SiO_2$, $ZrO_2$, $HfO_2$ or $Nb_2O_2$; Perovskite materials such as BST ($Ba_xSr_{1-x}TiO_3$), PZT ($PbZr_xTi_{1-x}O_3$) or PLZT ($Pb_{l-y}La_yZr_xTi_{1-x}O_3$); or Bi-layered compounds such as $SrBi_2Ta_2O_9$. Here $0 \leq x \leq 1$, $0 < y < 1$ hold. Further, an organic material that is a mixture of inorganic or magnetic materials may be used as the dielectric material constituting the capacitor.

Furthermore, one or a plurality of layers of the second insulating layers 14 of second wiring structure 17 may be formed from a material having a dielectric constant of 9 or greater, and opposing electrodes may be formed at desired positions of the wiring layers above and below, thereby providing a capacitor that performs the role of a circuit noise filter. Preferred as the dielectric material for forming the capacitor are metal oxides such as titanium oxide, tantalum oxide, $Al_2O_3$, $SiO_2$, $ZrO_2$, $HfO_2$ or $Nb_2O_2$; Perovskite materials such as BST ($BaxSr_{1-x}TiO_3$), PZT ($PbZr_xTi_{1-x}O_3$) or PLZT ($Pb_{1-y}La_yZr_xTi_{1-x}O_3$); or Bi-layered compounds such as $SrBi_2Ta_2O_9$. Here $0 \leq x \leq 1$, $0 < y < 1$ hold. Further, an organic material that is a mixture of inorganic or magnetic materials may be used as the dielectric material constituting the capacitor.

Relating to the method according to the second aspect, following modes may be employed.

For forming the metal post, the metal post may be formed on the second wiring layer by a plating method.

The method may further comprise forming a passivation film between said forming the first wiring structure and said forming the second wiring structure.

In the method, the forming the second wiring layer and the forming of the metal post may be performed by electroplating using a same feed layer.

For exposing the metal post, the surface of the second insulating layer may be polished using CMP.

As many apparently widely different embodiments of the present invention can be made without departing from the spirit and scope thereof, it is to be understood that the invention is not limited to the specific embodiments thereof except as defined in the appended claims. It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
a semiconductor substrate;
a first wiring structure placed on said semiconductor substrate and having one or more first wiring layers, one or more insulating layers and a first via;
a second wiring structure placed on said first wiring structure and having one or more second wiring layers, one or more second insulating layers, a second via and a third via; and
an external terminal provided on said second wiring structure;
wherein the second via, which is connected to the second wiring layer of said second wiring structure and to said external terminal, has a connection interface disposed at an end portion of the second via that is on the side of said external terminal, and the second via has an end portion on the side of said semiconductor substrate that is integrated with the second wiring layer so as to follow a grain boundary of the second wiring layer.

2. The device according to claim 1, wherein all second vias provided in said second wiring structure have their connection interfaces disposed at an end portion thereof that is on the side of said external terminal.

3. The device according to claim 1, wherein the second via has been formed by a plating method on the second wiring layer on the side of said semiconductor substrate.

4. The device according to claim 1, wherein the second wiring layer has an adhesion layer on a surface on the side of said semiconductor substrate.

5. The device according to claim 4, wherein the second via and the third via have the adhesion layer on the connection interface.

6. The device according to claim 1, wherein the second wiring layer is thicker than the first wiring layer.

7. The device according to claim 1, wherein the second insulating layer is thicker than the first insulating layer.

8. The device according to claim 1, wherein the second insulating layer has an elastic modulus lower than that of the first wiring layer.

9. The device according to claim 1, wherein the second insulating layer has an elastic modulus at 25° C. that is equal to or greater than 1 GPa and not more than 8 GPa.

10. The device according to claim 1, wherein the relation b/a>d/c holds, where a represents the cross-sectional area of the third via on the side of said semiconductor substrate, b represents the cross-sectional area of the third via on the side of the second wiring, c represents the cross-sectional area of the second via, which is provided in said second wiring structure, on the side of said semiconductor substrate, and d represents the cross-sectional area of the second via, which is provided in said second wiring structure, on the side of said external terminal.

11. The device according to claim 1, wherein the first wiring layer and the second wiring layer comprise at least one metal selected from the group consisting of copper, aluminum, nickel, gold and silver or alloys thereof.

12. The device according to claim 1, wherein said external terminal has a surface comprising at least one metal selected from the group consisting of copper, aluminum, gold, silver and solder material or alloys thereof.

13. The device according to claim 1, wherein the adhesion layer comprises at least one metal selected from the group consisting of titanium, tungsten, nickel, tantalum, vanadium, chrome, molybdenum, copper and aluminum or alloys thereof.

14. The device according to claim 1, wherein the second insulating layer comprises an organic resin.

15. The device according to claim 1, wherein a passivation film in which the third via is provided is interposed between said first wiring structure and the second insulating layer.

16. The device according to claim 15, wherein the passivation film comprises an organic resin.

17. The device according to claim 1, wherein at least the number of external terminals is reduced by gathering a plurality of power wires together in said second wiring structure.

18. The device according to claim 1, wherein at least the number of external terminals is reduced by gathering a plurality of ground wires together in said second wiring structure.

19. A method of manufacturing a semiconductor device, comprising:
forming a first wiring structure, which has a first insulating layer, a first wiring layer and a first via, on a semiconductor substrate on which semiconductor elements have been formed;
forming a second wiring structure, which has a second insulating layer, a second wiring layer, a second via and a third via, on the first wiring structure; and
forming an external terminal on the second wiring structure;
wherein said forming the second wiring structure includes:
forming the second wiring layer;
forming a metal post, which will serve as the second via, on the second wiring layer;
covering the second wiring layer and the metal post with the second insulating layer; and
exposing the metal post by polishing the surface of the second insulating layer.

* * * * *